(12) United States Patent
Volluz et al.

(10) Patent No.: US 8,568,032 B2
(45) Date of Patent: Oct. 29, 2013

(54) CLEAN ROOM-SUITABLE LINEAR GUIDE

(75) Inventors: Patrick Volluz, Colombier NE (CH);
Gentien Piaget, Corgémont (CH);
Jean-Yves Bordas, Doubs (FR)

(73) Assignee: Etel S.A., Motiers (CH)

( * ) Notice: Subject to any disclaimer, the term of this patent is extended or adjusted under 35 U.S.C. 154(b) by 159 days.

(21) Appl. No.: 13/056,229

(22) PCT Filed: May 28, 2009

(86) PCT No.: PCT/EP2009/003813
§ 371 (c)(1),
(2), (4) Date: Jan. 27, 2011

(87) PCT Pub. No.: WO2010/012331
PCT Pub. Date: Feb. 4, 2010

(65) Prior Publication Data
US 2011/0120339 A1    May 26, 2011

(30) Foreign Application Priority Data

Jul. 31, 2008 (DE) .......................... 10 2008 035 949

(51) Int. Cl.
*F16C 32/06* (2006.01)
(52) U.S. Cl.
USPC ........................................................... 384/12

(58) Field of Classification Search
USPC ......... 384/12, 15, 45, 59; 198/468.9; 411/395
See application file for complete search history.

(56) References Cited

U.S. PATENT DOCUMENTS

| | | | | |
|---|---|---|---|---|
| 4,802,774 A | * | 2/1989 | Pesikov | 384/12 |
| 4,955,244 A | | 9/1990 | Katahira | |
| 4,968,155 A | * | 11/1990 | Bode | 384/45 |
| 5,011,300 A | * | 4/1991 | Teramachi | 384/25 |
| 5,228,353 A | | 7/1993 | Katahira et al. | |
| 5,713,244 A | | 2/1998 | Ito et al. | |
| 6,086,255 A | * | 7/2000 | Lyon | 384/12 |
| 6,571,932 B1 | | 6/2003 | Kawashima et al. | |
| 7,306,372 B2 | * | 12/2007 | Nakamura et al. | 384/45 |
| 7,651,272 B2 | * | 1/2010 | Kawai et al. | 384/12 |
| 7,883,269 B2 | * | 2/2011 | Iida et al. | 384/15 |
| 2007/0071372 A1 | | 3/2007 | Kuwabara et al. | |
| 2008/0151213 A1 | * | 6/2008 | Arai | 355/72 |

FOREIGN PATENT DOCUMENTS

WO    WO 2006082686 A1 *   8/2006

* cited by examiner

*Primary Examiner* — Thomas R Hannon
*Assistant Examiner* — Adam D Rogers
(74) *Attorney, Agent, or Firm* — Brinks Hofer Gilson & Lione

(57) ABSTRACT

A linear guide including a rail and a carriage joined to an application platform by a plurality of screws, wherein at least one of the plurality of screws is a vacuum screw with an axial channel through which particles can be vacuumed out of an air gap between the rail and the carriage.

4 Claims, 3 Drawing Sheets

CLEAN ROOM-SUITABLE LINEAR GUIDE

Applicants claim, under 35 U.S.C. §§120 and 365, the benefit of priority of the filing date of May 28, 2009 of a Patent Cooperation Treaty patent application, copy attached, Serial Number PCT/EP2009/003813, filed on the aforementioned date, the entire contents of which are incorporated herein by reference, wherein Patent Cooperation Treaty patent application Serial Number PCT/EP2009/003813 was not published under PCT Article 21(2) in English.

Applicants claim, under 35 U.S.C. §119, the benefit of priority of the filing date of Jul. 31, 2008 of a German patent application, copy attached, Serial Number 10 2008 035 949.1, filed on the aforementioned date, the entire contents of which is incorporated herein by reference.

BACKGROUND OF THE INVENTION

1. Field of the Invention

The present invention relates to a clean room-suitable linear guide. In operation, such linear guides release as few particles as possible, so that the clean room does not become contaminated.

2. Description of the Related Art

The manufacture of integrated circuits is done today in so-called clean rooms, since the contamination of a wafer, with even the smallest particles, can lead to failure of the circuits to be manufactured. For all the devices and machines used in a clean room, there is accordingly the requirement that as few particles as possible be generated.

Since during the manufacturing process wafers have to be moved, it is not possible to dispense with moving parts. The use of air bearings, which operate in contactless fashion and thus without abrasion, is not always possible for reasons of cost. Thus, guides are also used that are based on conventional bearings, such as ball bearings or slide bearings. Even if such bearings are made from especially low-abrasion materials, the formation of particles cannot be avoided. Apparatuses are therefore known in which particles that occur are vacuumed away by a vacuum device before they can get into the surroundings and contaminate the clean room.

U.S. Pat. No. 4,955,244, for instance, describes a clean room-suitable apparatus with a linear drive resting on a recirculating ball spindle. At the rotor, particles generated in the interior of its housing are vacuumed away through an opening in the housing. For that purpose, a vacuum device is attached to the lubrication nipple of the housing.

SUMMARY AND OBJECTS OF THE INVENTION

It is an object of the present invention to find an embodiment for a linear guide which is as simple as possible, stable, and above all suitable for a clean room, and in which particles created from friction can be vacuumed away.

This object is attained by a linear guide having a rail and a carriage in which the carriage is joined to an application platform by screws. One of the screws is a vacuum screw with an axial channel through which particles can be vacuumed away from an air gap between the rail and the carriage.

Further advantages and details of the present invention will become apparent from the ensuing description of a preferred embodiment in conjunction with the drawings. In the drawings:

DESCRIPTION OF THE PREFERRED EMBODIMENT(S) OF THE INVENTION

Figure 1:
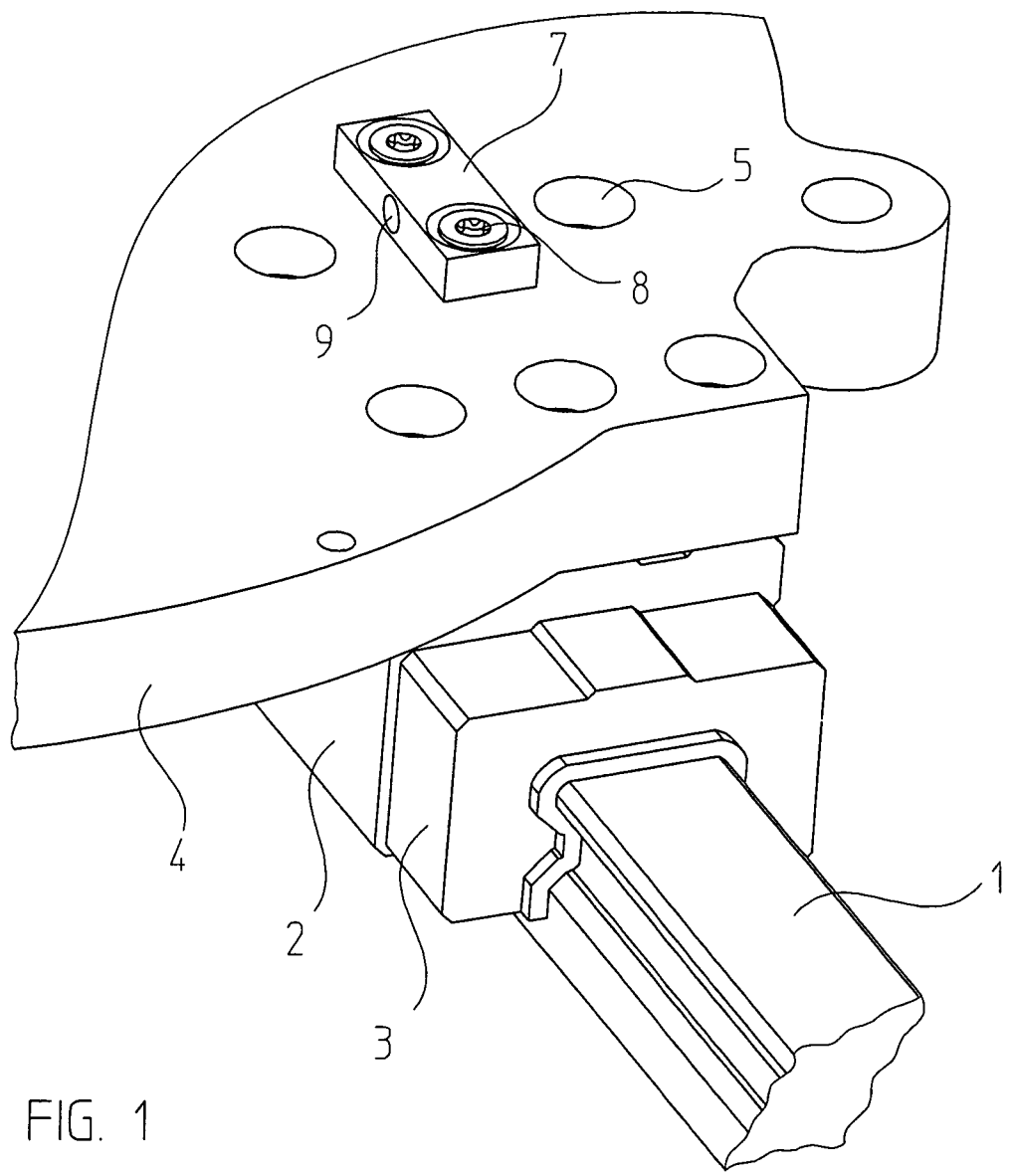
FIG. 1 shows an embodiment of a linear guide with an application platform in accordance with the present invention.

FIG. 1 shows a linear guide with a rail 1, on which a carriage 2 is supported linearly movably. For special applications, the rail 1 can also be curved, so that the carriage 2 can perform rolling, yawing or pitching motions. The carriage 2 has a covering 3 on both ends, which closes off a gap, such as the air gap 10 between the rail 1 and the carriage 2 as well as possible, wherein the gap contains air. This makes it more difficult for particles generated by abrasion to escape. An application platform 4, hereinafter also simply called a table 4, is joined to the carriage 2, so that the table 4 itself is linearly movable. The table 4 can certainly be held by a plurality of linear guides, or by two or more carriages 2 that run on a common rail 1.

Figure 2:
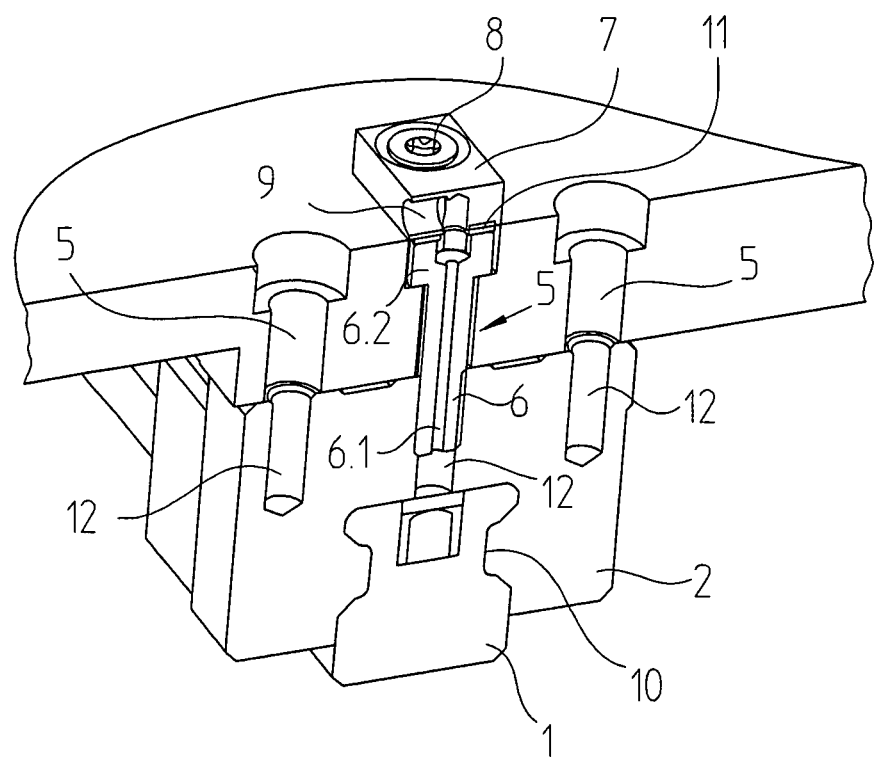
FIG. 2 is a sectional view of FIG. 1.
Figure 3:
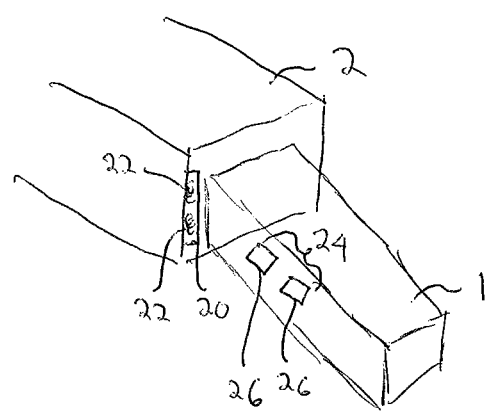

The details of the joining of the table 4 to the carriage 2 are shown in the sectional view in FIG. 2.

In section, three bores 5 penetrating the table 4 can be seen. Corresponding bores 12 with a female thread are provided on the carriage 2. Via screws 6 (in FIG. 2, only the middle screw is shown), the table 4 can be joined to the carriage 2.

The middle bore of the three bores 12 in the carriage 2 ends in the air gap 10 between the carriage 2 and the rail 1, preferably, as shown in FIG. 2, centrally of and above the rail 1. Since in such linear guides, balls or rollers typically run on both sides of the linear guide, and the rail 1, on its upper face opposite the middle bore of the three bores 12, itself has openings with screws for securing the rail 1 to a substrate, this middle bore 12 above the rail 1 does not impede the operation of the linear guide.

A vacuum screw 6 is inserted into each of the middle bores 5, 12 of the table 4 and carriage 2. Such vacuum screws 6 are typically employed in vacuum technology so that while a screw is being screwed in, an isolated air reservoir that would gradually give off air as the ambient air is pumped out and would thus impair the vacuum will not be created.

In accordance with this present invention, the vacuum screw 6 is employed in a completely different function. In part, the vacuum screw 6 contributes to the joining of the table 4 and the carriage 2, even if the conventional screws used in the other bores 5, 12 can exert a markedly higher tightening moment. However, above all, the vacuum screw 6 makes it possible to vacuum away particles from the air gap 10 between the rail 1 and the carriage 2. By the term "vacuum away," one of ordinary skill would understand that the particles would be extracted or removed from the air gap by suction in a manner similar that dirt is removed from a carpet by a vacuum cleaner.

Specifically, vacuum screws have a channel 6.1, by way of which the particles can be vacuumed away according to the present invention. For that purpose, the vacuum screw 6 has an axial bore, extending over the entire length of the vacuum screw 6, with a diameter of approximately half of a millimeter. Alternatively, the vacuum screw 6 can also have a lateral notch, through which air and particles can be vacuumed away.

Above the vacuum screw 6, a connection piece 7 can be seen, which is secured by screws 8 to the table 4. The connection piece 7 has an opening 9 for supplying a vacuum. This vacuum supply communicates in the interior of the connection piece with the channel 6.1 of the vacuum screw 6. For that purpose, between the connection piece 7 and the head 6.2 of the vacuum screw 6, a sealing ring 11 is inserted, which ensures a tight connection between the connection piece 7 and the vacuum screw 6.

If a vacuum device is now connected to the connection piece 7, an air flow and hence an underpressure are generated in the carriage 2, which ensure that particles can no longer escape between the covering 3 of the carriage 2 and the rail 1, since an air flow into the interior of the carriage 2 is created there. Particles in the interior of the carriage 2 are furthermore vacuumed away through the channel 6.1 of the vacuum screw 6 and through the connection piece 7. Accordingly, they cannot accumulate in the interior of the carriage 2. The waste air contaminated with the particles can furthermore be filtered without problems and/or can escape to outside the clean room. Thus the surroundings of the linear guide are optimally protected from the particles created by abrasion in the linear guide.

Since a single carriage 2 can also be secured by two or more vacuum screws 6 offset in the travel direction, and the table 4 can be secured on a plurality of carriages, it is advantageous if the carriage 4 has a vacuum connection from which, via branching vacuum hoses, the suction is distributed among the connection pieces 7. This distribution can be disposed in the interior of the table, like the connection pieces 7 themselves, so that the table 4 has a plane surface on the side on which it is used.

So-called direct drives, such as linear motors or torque motors, in which a primary part 20 with coils 22 is located opposite a secondary part 24 with a row of magnets 26 disposed with alternating polarity, are especially well suited as the drive for the carriage 2 and the table 4. Such direct drives have no gear and require no bearings of their own. Thus with direct drives, such components that additionally produce particles can be avoided.

The linear guide, with the vacuuming away of the particles according to the present invention, keeps primary part 20 and secondary part 24 movable counter to one another, for instance because the primary part 20 is joined to the carriage 2 or the table 4, and the secondary part 24 is joined to the rail 1 or to the substrate to which the rail 1 is also secured.

We claim:

1. A linear guide comprising:
   a rail;
   a carriage joined to an application platform by a plurality of screws, wherein at least one of said plurality of screws is a vacuum screw with an axial channel through which particles can be removed, via suction, out of an air gap located between said rail and said carriage, and wherein said vacuum screw is seated in a bore in said carriage, and wherein said bore ends in said air gap between said rail and said carriage; and
   a connection piece with an opening for supplying a vacuum, wherein said connection piece is secured to said application platform in such a way that said opening is joined to said axial channel.

2. The linear guide of claim 1, wherein said carriage comprises coverings that cover said air gap between said rail and said carriage.

3. The linear guide of claim 1, wherein a seal is disposed between said connection piece and said vacuum screw.

4. The linear guide of claim 3, wherein said seal comprises a sealing ring which is clamped between a head of said vacuum screw and said connection piece.

* * * * *

UNITED STATES PATENT AND TRADEMARK OFFICE
CERTIFICATE OF CORRECTION

PATENT NO. : 8,568,032 B2  
APPLICATION NO. : 13/056229  
DATED : October 29, 2013  
INVENTOR(S) : Patrick Volluz et al.

Page 1 of 1

It is certified that error appears in the above-identified patent and that said Letters Patent is hereby corrected as shown below:

On the Title Page

Left column, item (75), after "Patrick Volluz," replace "Colombler" with --Colombier--.

Signed and Sealed this  
Sixth Day of May, 2014

Michelle K. Lee  
*Deputy Director of the United States Patent and Trademark Office*